(12) United States Patent
Nandwana et al.

(10) Patent No.: US 12,578,184 B2
(45) Date of Patent: Mar. 17, 2026

(54) ENDPOINT DETECTION METHOD FOR CHAMBER COMPONENT REFURBISHMENT

(71) Applicant: ASM IP Holding B.V., Almere (NL)

(72) Inventors: Dinkar Nandwana, Chandler, AZ (US); Dinh Tran, Tempe, AZ (US); Allen D'Ambra, Phoenix, AZ (US); Gary Powell, Petaluma, CA (US); Christopher Falcone, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 555 days.

(21) Appl. No.: 18/076,788

(22) Filed: Dec. 7, 2022

(65) Prior Publication Data

US 2023/0184539 A1       Jun. 15, 2023

Related U.S. Application Data

(60) Provisional application No. 63/287,999, filed on Dec. 10, 2021.

(51) Int. Cl.
| | |
|---|---|
| *C23C 16/44* | (2006.01) |
| *G01B 11/06* | (2006.01) |
| *C23C 16/455* | (2006.01) |
| *C23C 16/52* | (2006.01) |

(52) U.S. Cl.
CPC ...... *G01B 11/0683* (2013.01); *C23C 16/4405* (2013.01); *C23C 16/45536* (2013.01); *C23C 16/45553* (2013.01); *C23C 16/52* (2013.01)

(58) Field of Classification Search
CPC .......... C23C 16/4407; C23C 16/45565; C23C 16/45553; C23C 16/45536; C23C 16/52; G01B 11/0683
See application file for complete search history.

(56) References Cited

U.S. PATENT DOCUMENTS

| | | | | |
|---|---|---|---|---|
| 5,392,124 | A * | 2/1995 | Barbee ............... | G01B 11/0683 |
| | | | | 216/60 |
| 6,406,641 | B1 | 6/2002 | Golzarian | |
| 2004/0014489 | A1 | 1/2004 | Miyachi | |
| 2010/0218788 | A1* | 9/2010 | Bao ..................... | C23C 16/4407 |
| | | | | 134/3 |
| 2022/0238355 | A1* | 7/2022 | Plavidal ........... | H01L 21/67028 |

\* cited by examiner

*Primary Examiner* — Joseph A Miller, Jr.
(74) *Attorney, Agent, or Firm* — Snell & Wilmer L.L.P.

(57) ABSTRACT

An endpoint detection system for use in detecting an endpoint of a refurbishment process for process chamber components. The refurbishment process involves use of an etchant bath to etch or clean chamber components after their use a reaction chamber in semiconductor processing to remove deposited materials including oxide films or the like. The endpoint detection system is configured to use measurements of reflected electromagnetic radiation from surfaces of the component in an etchant bath, transmitted electromagnetic radiation passing through holes in the chamber component while the component is in the etchant bath, or both to detect process endpoints. The process endpoints can coincide with a desired amount of removal of the deposited materials from surfaces and/or through holes in the chamber component. Upon detection of the endpoints, the chamber component can be removed from the etchant to limit over etching of materials from the chamber component to increase useful life.

10 Claims, 9 Drawing Sheets

Figure 3:
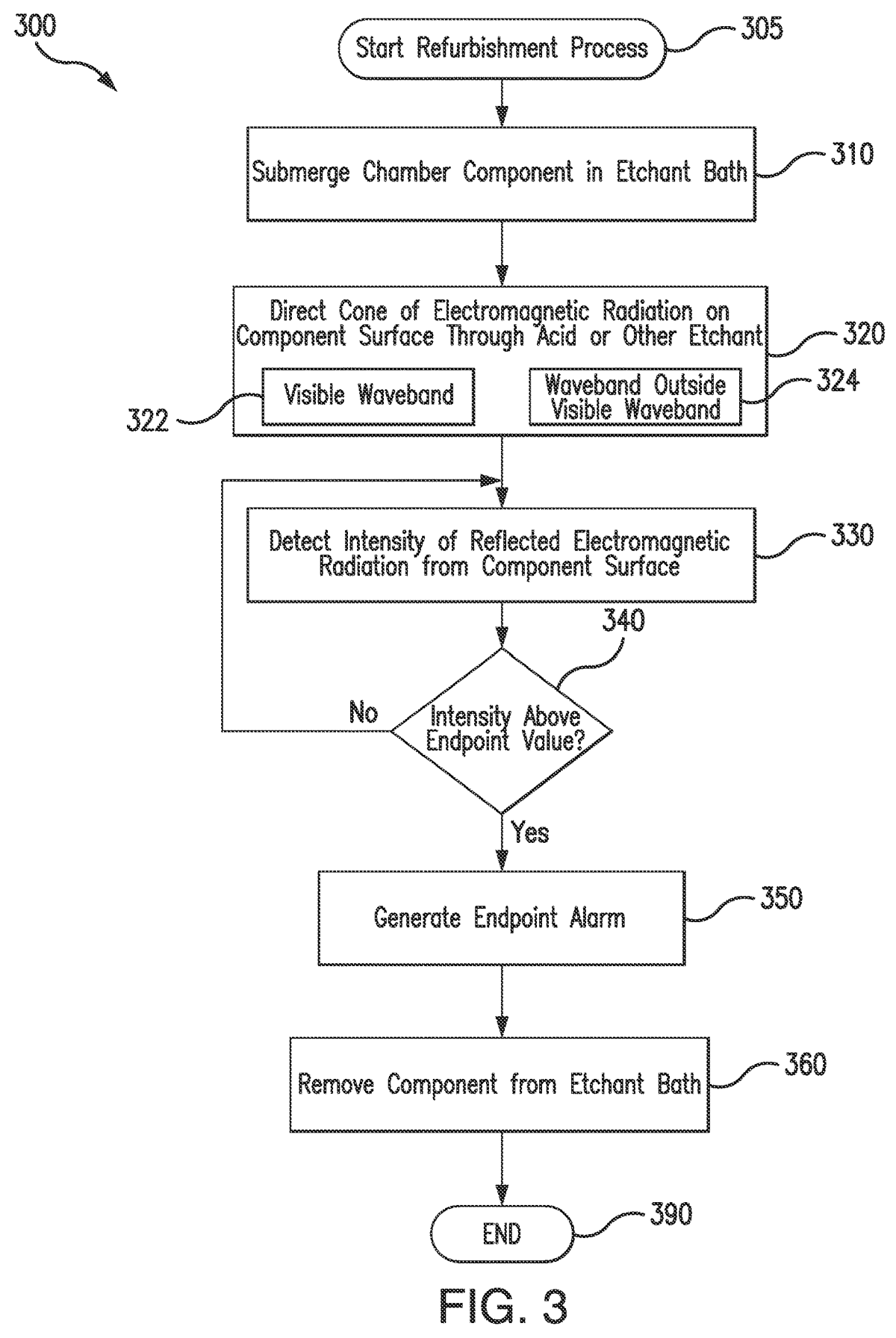

300

```
                        ( Start Refurbishment Process )——305
                                    │
                                    ▼
        ┌──────────────────────────────────────────┐
        │  Submerge Chamber Component in Etchant Bath │——310
        └──────────────────────────────────────────┘
                                    │
                                    ▼
        ┌──────────────────────────────────────────────────┐
        │  Direct Cone of Electromagnetic Radiation on        │
        │  Component Surface Through Acid or Other Etchant   │——320
        │  ┌────────────────────┐    ┌──────────────────────┐│
        │  │  Visible Waveband   │    │  Waveband Outside      ││——324
        │  │                    │    │  Visible Waveband     ││
        │  └────────────────────┘    └──────────────────────┘│
        └──────────────────────────────────────────────────┘
          322
                                    │
                                    ▼
        ┌──────────────────────────────────────────────────┐
        │  Detect Intensity of Reflected Electromagnetic      │——330
        │  Radiation from Component Surface                   │
        └──────────────────────────────────────────────────┘
                                    │
                                    ▼
                              ◇ 340
                      No    ╱ Intensity Above ╲
                   ◄────────   Endpoint Value?
                             ╲               ╱
                                  ◇
                                    │ Yes
                                    ▼
        ┌──────────────────────────────────────────┐
        │         Generate Endpoint Alarm            │——350
        └──────────────────────────────────────────┘
                                    │
                                    ▼
        ┌──────────────────────────────────────────┐
        │   Remove Component from Etchant Bath       │——360
        └──────────────────────────────────────────┘
                                    │
                                    ▼
                              ( END )——390
```

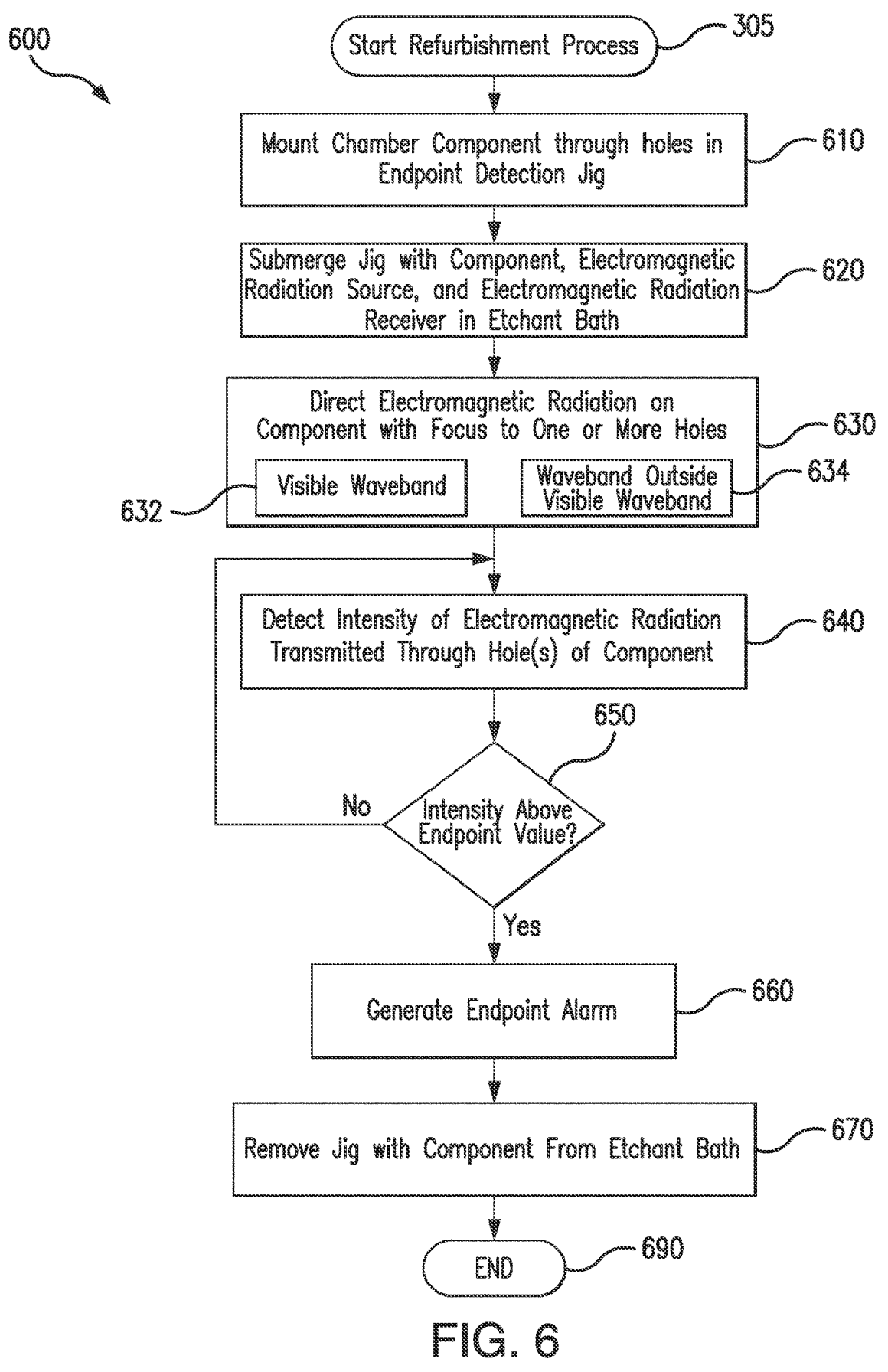

```
              ( Start Refurbishment Process )——305

↓

┌─────────────────────────────────────┐
      │  Mount Chamber Component through holes in │——610
      │      Endpoint Detection Jig           │
      └─────────────────────────────────────┘

↓

┌─────────────────────────────────────┐
      │  Submerge Jig with Component, Electromagnetic │——620
      │  Radiation Source, and Electromagnetic Radiation │
      │         Receiver in Etchant Bath      │
      └─────────────────────────────────────┘

↓

┌─────────────────────────────────────┐
      │    Direct Electromagnetic Radiation on  │——630
      │  Component with Focus to One or More Holes │
      │  ┌──────────────┐  ┌──────────────────┐ │——634
      │  │ Visible Waveband │  │ Waveband Outside │ │
      │  │              │  │ Visible Waveband │ │
      │  └──────────────┘  └──────────────────┘ │
      └─────────────────────────────────────┘
         632

↓

┌─────────────────────────────────────┐
      │  Detect Intensity of Electromagnetic Radiation │——640
      │   Transmitted Through Hole(s) of Component │
      └─────────────────────────────────────┘

↓            650

◇
               No    ╱ Intensity Above ╲
            ◄────────   Endpoint Value?
                       ╲             ╱
                         ◇

↓ Yes

┌─────────────────────────────────────┐
      │        Generate Endpoint Alarm        │——660
      └─────────────────────────────────────┘

↓

┌─────────────────────────────────────┐
      │ Remove Jig with Component From Etchant Bath │——670
      └─────────────────────────────────────┘

↓

(  END  )——690
```

FIG. 6

ENDPOINT DETECTION METHOD FOR CHAMBER COMPONENT REFURBISHMENT

CROSS-REFERENCE TO RELATED APPLICATIONS

This application is a nonprovisional of, and claims priority to and the benefit of, U.S. Provisional Application No. 63/287,999, filed on Dec. 10, 2021 and entitled "END-POINT DETECTION METHOD FOR CHAMBER COMPONENT REFURBISHMENT," the contents of which are incorporated by reference herein.

FIELD OF THE DISCLOSURE

The present disclosure relates generally to methods and systems for semiconductor process endpoint detection, and, more particularly, to methods and apparatus determining the completion of a refurbishment process, e.g., cleaning via an etchant bath, of a process chamber component so that the refurbishment process can be timely halted.

BACKGROUND OF THE DISCLOSURE

Semiconductor processing, including chemical vapor deposition (CVD), atomic layer deposition (ALD), and the like, is a well-known process for forming thin films of materials on substrates, such as silicon wafers. In a CVD process, for example, gaseous molecules of the material to be deposited are supplied to substrates to form a thin film of that material on the substrates by chemical reaction. Such formed thin films may be polycrystalline, amorphous, or epitaxial. Typically, CVD processes are conducted at elevated temperatures to accelerate the chemical reaction and to produce high quality films, and deposition materials (e.g., precursors, reactants, and the like) may be provided to a reaction chamber via various chamber structures such as a showerhead or the like via a liquid source.

During the semiconductor processing, process chamber structures including showerheads can become coated with the deposition materials. As a result, periodic cleaning of the process chamber components is useful to facilitate continued use of the components over long periods and numerous processing cycles. For example, an aluminum showerhead may become coated with a material layer that can cover the planar surfaces of the showerhead and can also fill or partially fill the passageways or through holes of the showerhead.

Cleaning of the showerhead typically involves submerging the showerhead in an acid bath until the material layer has been adequately removed from the surfaces of the showerhead. It is desirable that the showerhead or other piece of process chamber equipment only be cleaned for the minimum time needed to remove the material layer because additional exposure to the acid can result in over etching and removal of the bulk material forming the component, and/or a coating overlaying the bulk material, which, over multiple cleaning processes, can result in the component becoming unusable such as when a showerheads through holes become enlarged.

Existing endpoint detection techniques for such cleaning processes are not optimal and involve using a visual check and a measure of resistance to detect if deposition (e.g., CVD, ALD, or the like) on a chamber component has been removed. There remains a need for improved endpoint detection methods and systems for chamber component refurbishment because current techniques can lead to over etch or under etch of the chamber components.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Disclosed herein, according to various embodiments, is an endpoint detection system for use in detecting an endpoint of a refurbishment process for process chamber components. For example, the refurbishment process may involve use of an etchant, such as etchant bath, to etch or clean chamber components after their use a reaction chamber in semiconductor processing, such as chemical vapor deposition (CVD) and other deposition steps, to remove deposited materials including oxide films or the like. Briefly, the endpoint detection system is configured to use measurements of electromagnetic radiation reflected from surfaces of the component in an etchant, transmitted electromagnetic radiation passing through holes in the chamber component while the component is in the etchant bath, or both to detect a process endpoint. In many applications, the process endpoint will coincide with a desired amount of removal of the deposited materials from surfaces and/or through holes in the chamber component. Upon detection of the process endpoint, the chamber component can be removed from the etchant, or the etchant removed from the chamber component, to limit over etching of materials from the chamber component to increase its useful life. In certain examples, the electromagnetic radiation may include visible waveband electromagnetic radiation. In accordance with certain examples, the electromagnetic radiation may include electromagnetic radiation that is outside of the visible waveband, such as infrared waveband electromagnetic radiation.

In some exemplary embodiments of the description, a method is provided of detecting an endpoint of a refurbishment process for process chamber components (e.g., a showerhead used in deposition processes). The method includes submerging a process chamber component in a volume of etchant, such as an acid. The method continues with transmitting electromagnetic radiation from an electromagnetic radiation source through the etchant onto the process chamber component and receiving electromagnetic radiation from the process chamber component. Further, the method includes determining an endpoint of the refurbishment process for the process chamber component based on the received electromagnetic radiation.

In some cases, the received electromagnetic radiation includes electromagnetic radiation reflected from a surface of the process chamber component. The step of determining of the endpoint can include determining an intensity of the electromagnetic radiation reflected from the surface and comparing the intensity with a reflectance intensity threshold associated with the surface free of deposition materials. In the same or other cases, the received electromagnetic radiation can include electromagnetic radiation transmitted through the process chamber component via one or more through holes having inlets on a surface of the process chamber component. To transmit electromagnetic radiation through the holes of the component, the electromagnetic radiation from the electromagnetic radiation source can be non-collimated electromagnetic radiation focused on the inlets of the one or more through holes or can be collimated electromagnetic radiation provided to the inlets of the one or more through holes. When using transmission of electromagnetic radiation, the step of determining of the endpoint can include determining an intensity of the electromagnetic radiation transmitted from the one or more through holes and comparing the intensity with a transmission intensity threshold associated with a size of the one or more through holes. In some cases, both reflectance and transmission are utilized, and the endpoint is when both the reflectance intensity threshold and the transmission intensity threshold are determined to be met or exceeded.

In some implementations of the method, the method may also include mounting the process chamber component in a jig between the electromagnetic radiation source and an electromagnetic radiation receiving assembly adapted to perform the receiving step. In such cases, the submerging of the process chamber component can include at least partially submerging the jig in the etchant. The jig orients and aligns the process chamber component with the one or more through holes between the electromagnetic radiation source and an inlet of the electromagnetic radiation receiving assembly.

According to other aspects of the description, a system is provided for refurbishing a process chamber component including process endpoint detection. The system includes a tank with an interior space configured for receiving a volume of etchant. A electromagnetic radiation source is included that is operable to direct electromagnetic radiation through the etchant to a process chamber component positioned within the interior space. The system also includes an electromagnetic radiation receiver operable to receive electromagnetic radiation from the process chamber component, and a controller adapted to determine an endpoint of a refurbishment process for the process chamber component based on the received electromagnetic radiation.

In some examples of systems, the electromagnetic radiation source can include a non-collimated electromagnetic radiation source to provide the electromagnetic radiation on a surface of the process chamber component in a cone-shaped pattern, and the received electromagnetic radiation is electromagnetic radiation reflected from the surface. In such systems, the electromagnetic radiation receiver can include a spectrometer operable to determine an intensity of the electromagnetic radiation reflected from the surface, and the controller can act to determine the endpoint by comparing the intensity with a reflectance intensity threshold associated with the surface free of deposition materials.

In some or other examples of systems, entrapped air within the guide tube immersed within the etchant may optically couple the electromagnetic radiation source to the process chamber component. The electromagnetic radiation may be received from a first light source and a second light source, the first light source and the second light source optically coupled to the process chamber component by a dichroic mirror. A focusing lens may optically couple the process chamber component to the electromagnetic receiver.

In these or other examples of systems, the received electromagnetic radiation includes electromagnetic radiation transmitted through the process chamber component via one or more through holes having inlets on a surface of the process chamber component. The electromagnetic radiation source can be a collimated electromagnetic radiation source or a non-collimated electromagnetic radiation source and an optical assembly configured to focus electromagnetic radiation from the non-collimated electromagnetic radiation source onto the inlets of the one or more through holes. The system can further include a jig positioned in the interior spaced and supporting the electromagnetic radiation source and the electromagnetic radiation receiver, and the jig can be further configured to support the process chamber component between the electromagnetic radiation source and the electromagnetic radiation receiver. For example, the jig can be configured to align the process chamber component with the one or more through holes between the electromagnetic radiation source and an inlet of the electromagnetic radiation receiver.

According to further aspects of the description, a jig or fixture is provided for supporting a process chamber component during a refurbishment process. The jig includes a body and an electromagnetic radiation source assembly supported on a first arm extending outward from the body, where the electromagnetic radiation source assembly includes a housing and an electromagnetic radiation source positioned with the housing. The jig also includes an electromagnetic radiation receiver assembly supported on a second arm extending outward from the body. The electromagnetic radiation receiver assembly can include a housing and an electromagnetic radiation receiving element positioned with the housing, where the first and second arms align an outlet of the housing of the electromagnetic radiation source assembly with an inlet of the housing of the electromagnetic radiation receiver assembly. The jig also can include a third arm extending outward from the body that is configured for rigidly supporting the process chamber component between the housings of the electromagnetic radiation source assembly and the electromagnetic radiation receiving assembly such that at least one through hole in the process chamber component is disposed between the outlet of the housing of the electromagnetic radiation source assembly and the inlet of the housing of the electromagnetic radiation receiving assembly.

The body, housing, and arms can be fabricated of an etchant-resistant material (e.g., a material resistant to an etchant such as an acid). In some useful examples of the jig, the process chamber component is a showerhead, and the third arm is adapted for coupling with the showerhead. The electromagnetic radiation source can be a collimated electromagnetic radiation source or a non-collimated electromagnetic radiation source with an optical assembly adapted to focus output electromagnetic radiation from the non-collimated electromagnetic radiation source on the at least one through hole of the process chamber supported on the third arm. In some cases, the electromagnetic radiation receiving element is configured to process electromagnetic radiation from the electromagnetic radiation source that is transmitted through the one or more through holes and, to this end, includes at least one of a photomultiplier tube, a spectrometer, and a spectrometer modified for electromagnetic radiation scattering.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

FIG. 3 is a flow diagram for a refurbishment method for a process chamber component that includes use of measured intensities of reflected electromagnetic radiation to determine a process endpoint.

FIG. 6 is a flow diagram for a refurbishment method for a process chamber component that includes monitoring transmission of electromagnetic radiation via through holes or passageways in a process chamber component to determine a process endpoint.

DETAILED DESCRIPTION

Figure 1:
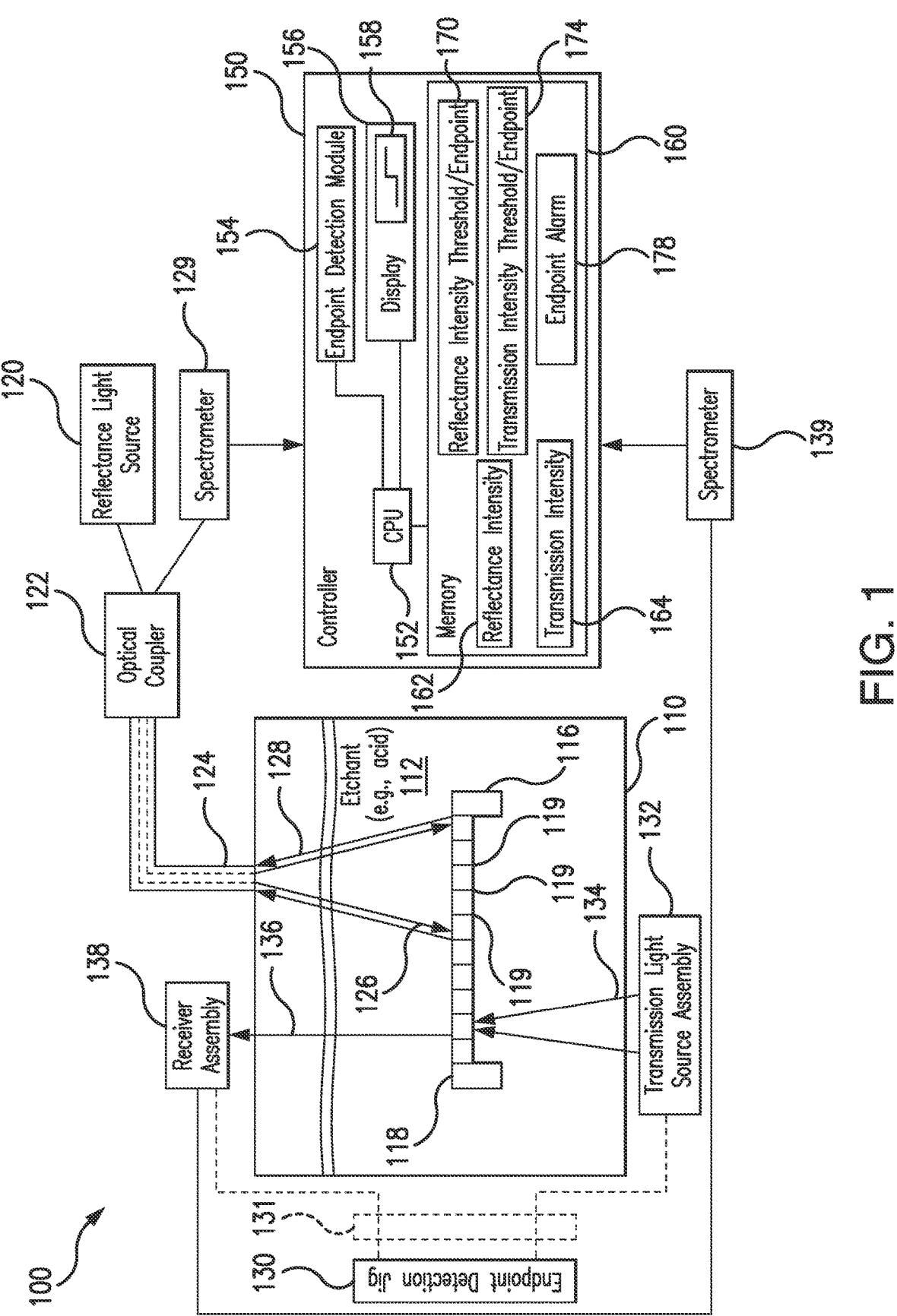
FIG. 1 is a functional block diagram of an endpoint detection system of the present description operable to use reflectance of electromagnetic radiation, transmission of electromagnetic radiation, or both to detect the endpoint of a process chamber component refurbishment.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "chemical vapor deposition" (CVD) may refer to any process wherein a substrate is exposed to one or more volatile precursors, which react and/or decompose on a substrate surface to produce a desired deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As described in greater detail below, various details and embodiments of the disclosure may be utilized in conjunction with refurbishment of process chamber components used within a reaction chamber during a multitude of deposition processes, including but not limited to, ALD, CVD, metalorganic chemical vapor deposition (MOCVD), and MBE, physical vapor deposition (PVD). The refurbishment may include etching or cleaning of materials or films of materials from surfaces of the process chamber components, including from within holes, through holes, or passageways extending through a body or a part of the process chamber components, and the etching or cleaning can be provided by use of a bath of nearly any useful etchant such as, but not limited to, deionized water or an acid such as hydrochloric acid.

The inventors recognized that prior methods of using visual checks or resistance checks to detect if semiconductor processing deposition on chamber components had been removed were not optimal because they can lead to over etching or under etching, which are both undesirable. An endpoint detection system and associated methods were designed to address these and other shortcomings.

The endpoint detection system according to one aspect is adapted to use optical reflectance spectroscopy. Particularly, the system is adapted to direct electromagnetic radiation, visible waveband electromagnetic radiation and/or electromagnetic radiation having wavelength outside of the visible waveband, to a chamber component positioned in an etchant, and a spectrometer reads the reflectance of the electromagnetic radiation. The electromagnetic radiation may have a plurality of wavelengths such as the visible light range and/or 400 to 900 nm, with wavelengths below 800 nm sometimes being preferable as above this level water and/or etchants may absorb the electromagnetic radiation. As the etchant etches away the deposition, the reflectance of the electromagnetic radiation from the chamber component surfaces changes, e.g., intensity of the reflected electromagnetic radiation increases. The change is fed into a controller, and, as soon as a predefined endpoint threshold value (e.g., a reflectance value associated with the reflected electromagnetic radiation from a base material for the chamber component such as bare aluminum when aluminum oxide deposition is removed) is detected, an alarm is signaled notifying the operator of the system that the component is cleaned.

The endpoint detection system according to a second aspect is adapted to use transmission of electromagnetic radiation, both direct and scattered in some cases, to detect the endpoint of an etchant bath cleaning process or of refurbishment. The inventors recognized that while reflectance may be optimal for plate-type structures many chamber components, such as showerheads, include through holes that require cleaning upon becoming clogged or partially filled with deposition materials and reflectance may not be useful for determining when these through holes are clean. To facilitate endpoint detection, electromagnetic radiation (e.g., white electromagnetic radiation, laser electromagnetic radiation, and so which may be in the visible range or may include electromagnetic radiation at wavelengths outside the visible band) is transmitted via the through holes of the chamber component to provide a way of detecting the cleaning of showerheads or other components with through holes. The transmitted electromagnetic radiation is monitored, as the reflected electromagnetic radiation was monitored above, to determine when an endpoint threshold value has been reached, and, once this value is reached, an alarm is generated to notify the operator that cleaning is completed (e.g., when the detected transmitted electromagnetic radiation matches that expected to pass through a hole of a particular diameter).

To facilitate monitoring of transmitted electromagnetic radiation in an etchant bath, the system may include an endpoint detection jig or fixture designed by the inventors for holding or supporting the process chamber component within the etchant bath between an electromagnetic radiation source and an electromagnetic radiation receiver at a known position and/or with an aligned orientation. In some exemplary implementations, the endpoint detection system (and associated method) can use both reflectance and transmission of electromagnetic radiation for endpoint detection, such as by concurrently performing endpoint detection by both of these techniques and indicating (e.g., via an alarm) an endpoint when both techniques indicate cleaning is complete (e.g., the process is continued for a time period required for the slower of the two processes).

FIG. 1 is a functional block diagram of an endpoint detection system 100 of the present description operable to use reflectance of electromagnetic radiation, transmission of electromagnetic radiation, or both to detect the endpoint of a process chamber component refurbishment. As shown, the system 100 includes a tank 110 for containing a volume of etchant 112 (e.g., an acid) that is selected for cleaning or etching deposition materials from a process chamber component 116. The component 116 is placed in the tank 110 so as to have all of its surfaces, or at least those requiring cleaning/refurbishment, submerged below the upper surface of the etchant 112. In some exemplary embodiments, the component is a showerhead formed of aluminum with the deposition material being aluminum oxide, but other examples of system 100 may be used to refurbish components formed of other metals or materials and have differing deposition materials, which may lead to a differing etchant (or set of etchants) used for the etchant 112. Components that may be cleaned can include pulse valve manifolds, susceptor heaters, gas channel plates, upper and lower flow control or chamber isolation rings, showerheads, and the like. The materials being removed can vary and can include aluminum oxide, titanium nitride, hafnium oxide, tungsten nitride, molybdenum, and other materials deposited or used in processing of substrates/wafers. The etchants can also vary and be chosen to suit the material to be removed and the material of the component being cleaned, with exemplary etchants including hydrofluoric acid, nitric acid, potassium hydroxide, and others known and used in the semiconductor processing industry.

The system 100 is adapted to detect the endpoint of the cleaning process, i.e., when a deposition material has been etched away from the surfaces of the component 116 that may include planar surfaces 118 and inner surfaces of through holes 119. Endpoint detection can be achieved using reflectance and/or transmission of electromagnetic radiation in the etchant bath or tank 110 or by concurrent performance of both techniques.

With regard to use of reflectance to detect an endpoint, the system 100 is shown to include a reflectance electromagnetic radiation source 120 that is coupled via an optical coupler 122 to a bifurcated optical cable 124 (e.g., a bundle of optical fibers with a center fiber or set of fibers used to provide electromagnetic radiation from the source 120 and an outer ring of fibers used to collect reflected electromagnetic radiation 128 and provide it to spectrometer 129). In some implementations, separate fibers or cables may be used for sending and for receiving. During system 100 operations, the electromagnetic radiation source 120 provides electromagnetic radiation that is shown with arrows 126 to be directed through the etchant 112 onto the surface 118 of the process chamber component. The electromagnetic radiation 126 typically is directed directly downward onto the surface 118, such as with a center line of the cone of electromagnetic radiation 126 orthogonal to the surface 118, but this is not required if a receiver for reflected electromagnetic radiation 128 is provided separate from the optical cable 124. The electromagnetic radiation 126 is not collimated in exemplary embodiments but is, instead, provided in the shape of a electromagnetic radiation cone to contact a wider surface area and provide a larger amount of reflected electromagnetic radiation shown with arrows 128 from the component 116. The electromagnetic radiation source 120 may be a halogen electromagnetic radiation source to provide electromagnetic radiation 126 over a relatively wide range of wavelengths or other electromagnetic radiation sources, such as a tungsten/mercury electromagnetic radiation bulb, an electromagnetic radiation emitting diode (LED) of a particular color, or the like, may be used to provide electromagnetic radiation in specific wavelengths.

The reflected electromagnetic radiation 128 is collected by the optical cable 124 and returned, via the optical coupler 122, to a spectrometer 129, which detects a spectra or the intensity of the reflected electromagnetic radiation 128 during the refurbishment process performed by system 100. The output signal or electromagnetic radiation intensity value is provided to a controller 150 for processing. The controller 150 includes a processor 152 that manages a memory or data storage 160 and that runs code or executes instructions (e.g., provided in software programs in local memory 160) to provide the functions of an endpoint detection module 154.

These function of module 154 include receiving and storing outputs of spectrometer 129 as shown as reflectance intensity 162 in memory 160. The memory 160 is also used to store one or more reflectance intensity thresholds or endpoint values 170, which define for a particular component 116 and its base materials spectra or intensity values of reflected electromagnetic radiation 128 that are indicative of completion of cleaning process for surface 118. In this regard, testing has shown that electromagnetic radiation intensity of electromagnetic radiation reflected by a component does change when its surfaces are cleaned of deposition material down to (or nearly so) the base material.

Figure 2:
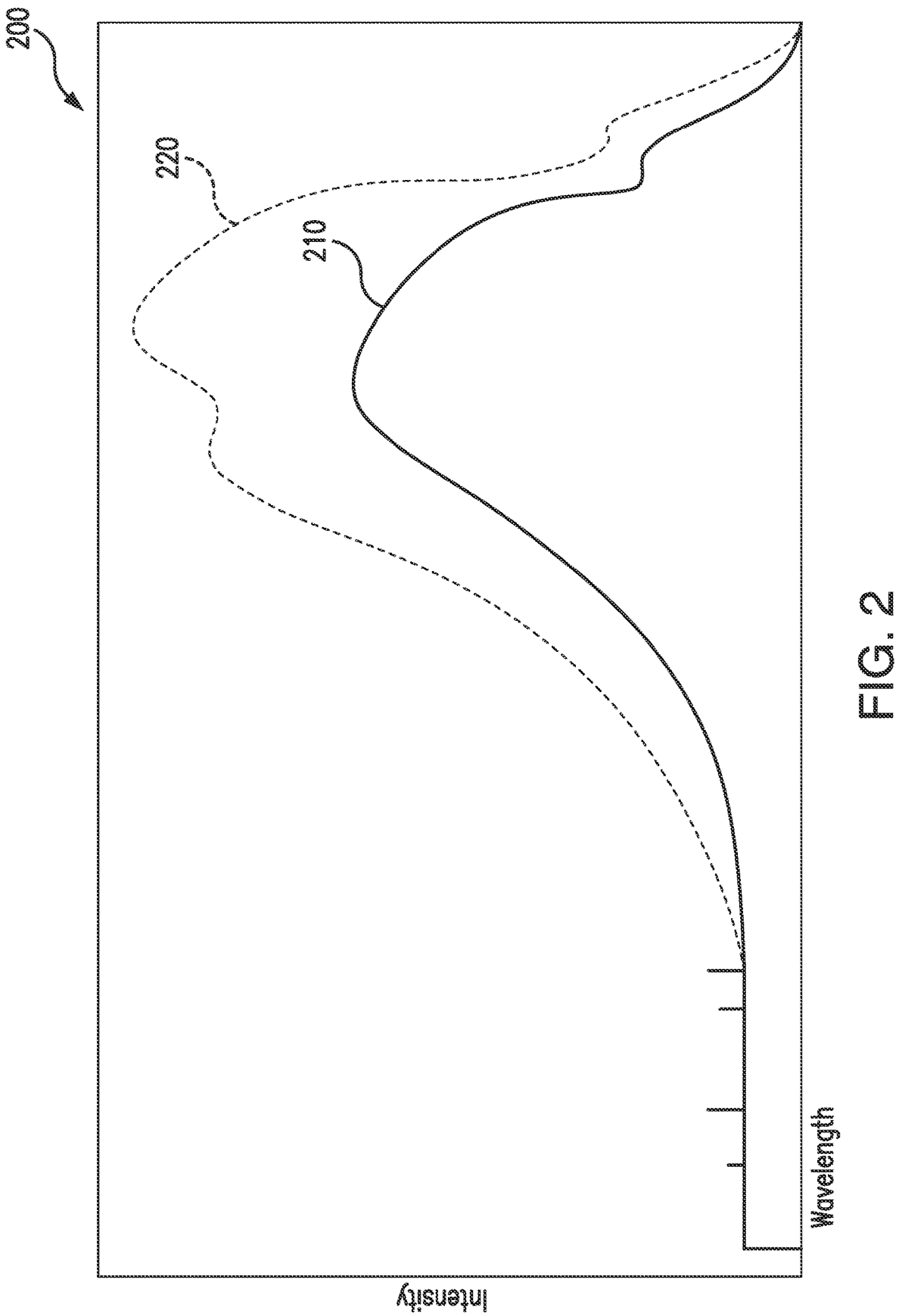
FIG. 2 illustrates a graph of electromagnetic radiation intensities for a range of electromagnetic radiation wavelengths illustrating a spectra change between aluminum oxide and aluminum (or bare aluminum).

For example, FIG. 2 illustrates a graph 200 of electromagnetic radiation intensities for a range of electromagnetic radiation wavelengths illustrating a spectra change between aluminum oxide, shown with line 210, and aluminum (or bare aluminum), shown with dashed line 220. As shown, the spectra 220 is significantly or at least detectably higher for bare aluminum than the spectra 210 for an aluminum oxide film (or surface 118 covered with aluminum oxide). Hence, the endpoint threshold 170 for reflectance may be set at an intensity some point above the highest value expected for the deposition material (e.g., aluminum oxide) or a value in the range of the spectra 220 that includes the peak for the base material (e.g., aluminum) as an indication that surface 118 has been adequately cleaned of the deposition material. Note, the reflectance intensity threshold or endpoint value 170 may vary with the base material of surface 118, with the deposition material being cleaned, and/or with the electromagnetic radiation 126 provided by source 120 such that testing typically is performed to define the value 170. Further, the display 156 may be operated during cleaning operations to provide a display 158 of the presently measured reflectance intensity 162 as well as the threshold/endpoint value 170 to provide an operator an indication of progress or status of the refurbishment process being performed by system 100.

During operations of the system 100, the endpoint detection module 154 functions to compare the sensed or detected reflectance intensity 162 to the reflectance intensity threshold 170. When the reflectance intensity 162 meets or exceeds this threshold 170, the module 154 may generate an alarm as defined in memory 160 as shown at 178 to alert an operator that the component 116 is clean based on reflectance monitoring and, in some cases, may be removed from the tank or bath 110 (such as cases in which there are no through holes 119 or when both reflectance and transmission are being used and transmission has provided an indication that the through holes 119 are already cleaned of deposition materials). The endpoint alarm 178 may be defined so as to cause the module 154 to operate, via processor 152, the display (or operator's station) 156 to provide an audible alarm and/or a visual alert (e.g., turn a process endpoint electromagnetic radiation from red to green or the like).

FIG. 3 is a flow diagram for a refurbishment method 300 for a process chamber component that includes use of measured intensities of reflected electromagnetic radiation to determine a process endpoint. Method 300 can involve operations of system 100 during refurbishment of component 116 (e.g., when the component 116 does not include through holes 119). The method 300 starts at step 305 such as with providing the electromagnetic radiation source 120 and optical fiber 124 relative to a tank 110 filled with an acid or another etchant 112 and with providing a controller 150 running an endpoint detection module 154. The method 300 continues at 310 with submerging a chamber component, such as component 116, in the etchant bath or tank 110 such that its surfaces, including surface 118, that require cleaning are below the level of the etchant 112. The method 300 then continues at 320 with operating the electromagnetic radiation source 120 to direct a cone of electromagnetic radiation 126 through the acid or other etchant 112 on the component surface 118. In certain examples the electromagnetic radiation 126 may be within the visible waveband, as shown at box 322. In accordance with certain examples, the electromagnetic radiation 126 may be outside of the visible waveband, as shown at box 324. For example, the electromagnetic radiation 126 may be within the infrared waveband.

Step 330 is then performed that includes detecting, such as with spectrometer 129, the intensity of the reflected electromagnetic radiation 128 from the component surface 118. The method 300 continues with step 340 with the controller 150 using the endpoint detection module 154 to determine whether the detected reflectance intensity 162 is above the reflectance intensity threshold 170. If not, the method 300 is continued at 330 with continued monitoring of the reflected electromagnetic radiation 128 and its intensity. If yes at 340, the method 300 continues at 350 with generating an endpoint alarm (as defined at 178 in FIG. 1). Next, the method 300 includes removing the component 116 from the etchant 112 in etchant bath or tank 110. The refurbishment or semiconductor process is then ended at step 390.

Figure 5:
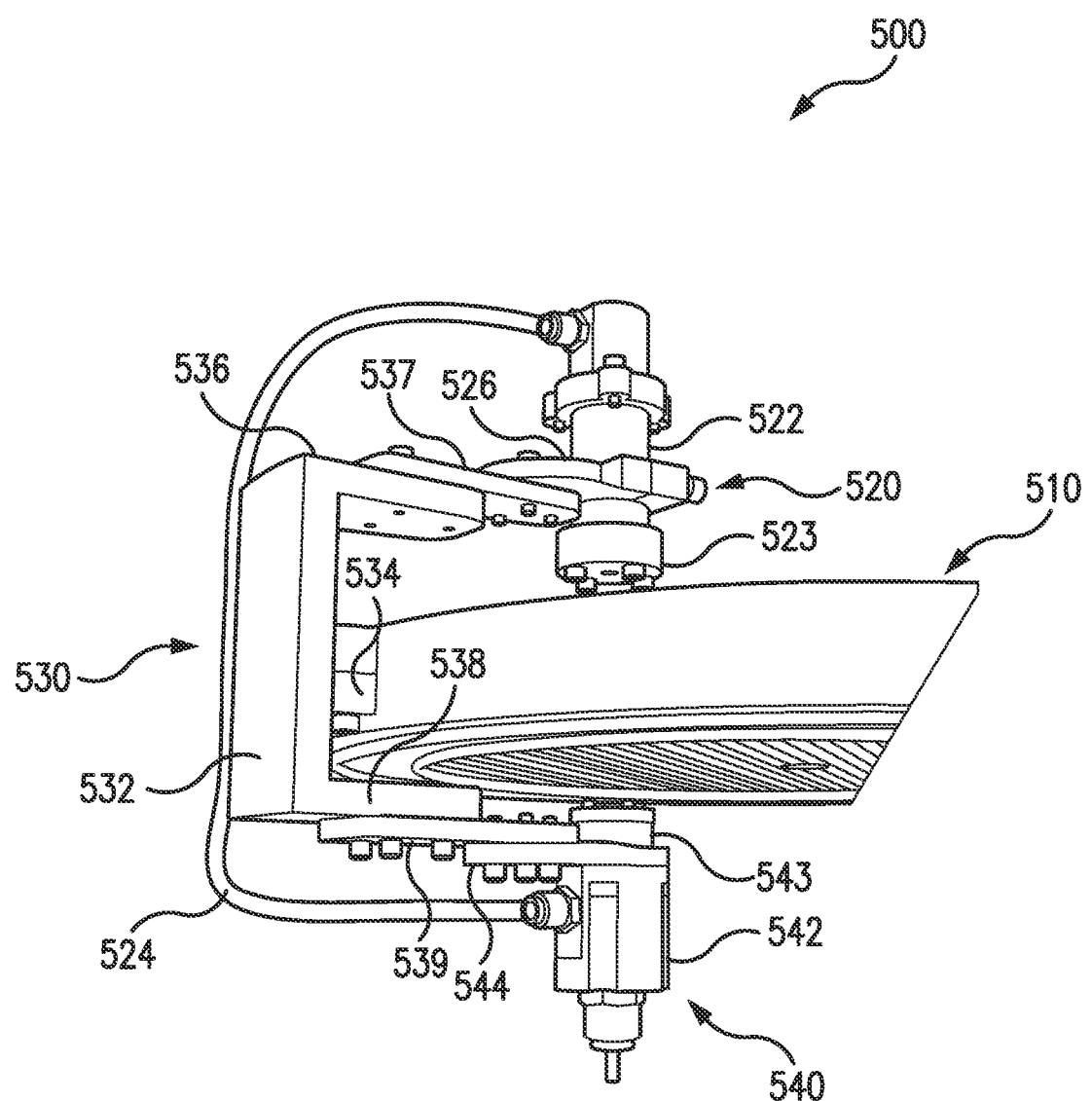
FIG. 5 illustrates an exemplary embodiment of an endpoint detection jig of the present description that may be used in an etchant bath of the system of FIG. 1 to support a chamber component with through holes between an electromagnetic radiation source and an electromagnetic radiation receiver in a predefined position and/or with aligned orientation.

With regard to use of transmission to detect an endpoint, the system 100 is shown to include an endpoint detection jig or fixture 130. The jig 130, as discussed below with reference to FIG. 5, is configured to couple with and support a transmission assembly 132 and a receiver assembly 138 as shown with dashed lines 131. As shown, the transmission assembly 132 and the receiver assembly 138 may be positioned outside the tank/vessel 110 above and below the component 116 (as shown or with their location reversed) or may be located otherwise on opposite sides of the component 116 such as if the component is placed on its side in etchant 112 with the through holes 119 running horizontally instead of vertically as shown in FIG. 1.

Further, the system 100 includes a transmission electromagnetic radiation source assembly 132. This assembly 132 typically will include a body or housing. The jig 130 is configured to be connected with and support the electromagnetic radiation source assembly 132 outside the tank or vessel 110 (e.g., above, below, or to the side of tank/vessel 110). Particularly, the housing or body of the assembly 132 is supported by the jig in a position relative the component 116 such that an electromagnetic radiation outlet in the housing or body is directed toward a surface opposite the surface 118 and one or more of the through holes 119.

The transmission electromagnetic radiation source assembly 132 includes an electromagnetic radiation source that, when operated or powered on, outputs or provides electromagnetic radiation 134 that is focused upon one or more through holes 119. The source assembly 132, to this end, may include an optical assembly for focusing the output electromagnetic radiation 134 onto the component 116 and a focusing mechanism to move one or more of the optical elements (e.g., lenses) of the optical assembly to achieve such focusing. The transmission electromagnetic radiation source in assembly 132 may be an LED or similar electromagnetic radiation source that is focused in this manner or may take the form of a white or colored (e.g., red, green, or other color) laser to provide collimated electromagnetic radiation to one or more of the through holes 119. In contrast to the reflectance electromagnetic radiation 126, the transmission electromagnetic radiation 134 is focused or collimated to have a greater intensity for enhanced detection upon passing through the component 116 via the one or more through holes 119.

To monitor transmission, the system 100 further includes a receiver assembly 138 adapted to receive or collect electromagnetic radiation 136 (i.e., a portion of electromagnetic radiation 134) transmitted through the component 116 via one or more through holes 119. The receiver assembly 138 may include a body that is coupled to and supported by the endpoint detection jig 130 outside the vessel or tank 110 as shown with dashed lines 131. The receiver assembly 138 may include an electromagnetic radiation inlet for receiving the electromagnetic radiation 136, and the jig 130 is configured to support the housing or body of the receiver assembly 138 such that the electromagnetic radiation inlet is aligned with the electromagnetic radiation outlet of the electromagnetic radiation source assembly 132 (e.g., so that the inlet is aligned with the same one or more through holes 119 targeted or focused upon by the source assembly and its electromagnetic radiation outlet). The receiver assembly 138 may include an optical assembly with one or more components for receiving the electromagnetic radiation 136, which may then be transmitted via optic fiber to a spectrometer 139. In other cases, the spectrometer 139 may be positioned within the housing or body of the receiver assembly 138.

The spectrometer 139 detects or determines the intensity of the transmitted electromagnetic radiation 136, and this data is transmitted to the controller 150 for storage in memory 160 as shown at 164. The endpoint detection module 154 then functions to process the transmission intensity to determine whether it matches or exceeds the stored transmission intensity threshold or endpoint value 174. If so, the endpoint is detected for refurbishment of the component 116 or at least for the through holes 119. The module 154 may then act to generate an endpoint alarm as defined in file 178 in memory 160, and this may involve operating the display to change an indicator from red to green or to illuminate a process endpoint indicator while other alarms may include audible portions such as like the ringing of an alarm clock or the like. The module 154 may also operate the display 156 to generate a graph 158 providing spectra or other information over time (e.g., time of the cleaning process or refurbishment of the component 116).

Figure 4:
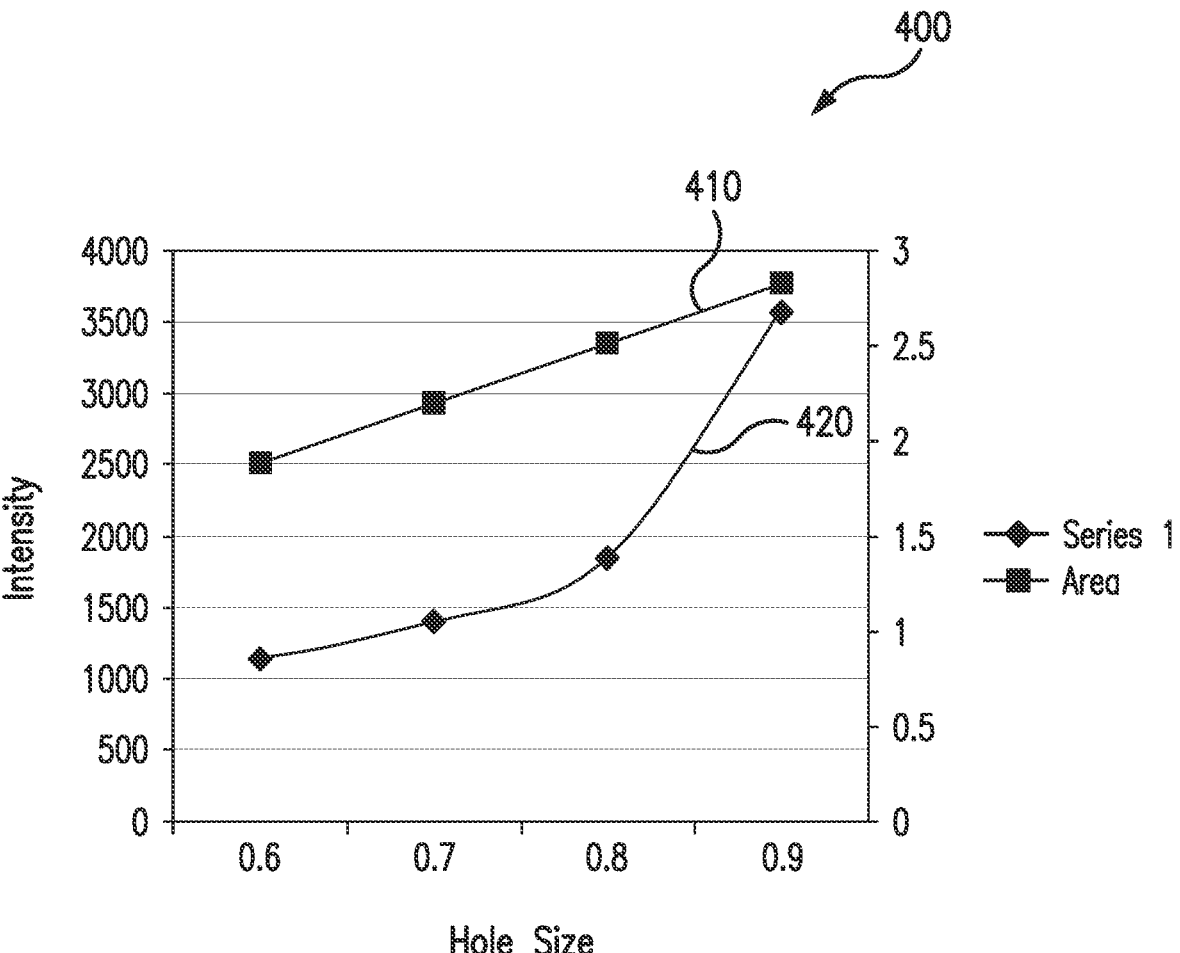
FIG. 4 illustrates a graph showing electromagnetic radiation intensity changes for transmitted electromagnetic radiation relative to hole or through hole sizes as may be present in a process chamber component.

In this example, intensity of the transmitted electromagnetic radiation 136 is measured to detect the endpoint. FIG. 4 illustrates a graph 400 showing electromagnetic radiation intensity changes for transmitted electromagnetic radiation relative to hole or through hole sizes as may be present in a process chamber component. In graph 400, line 410 shows increasing cross sectional area of holes at various hole sizes while line 420 shows differences in transmitted electromagnetic radiation intensity for the differing holes sizes. The graph 400 shows that with increasing hole diameter electromagnetic radiation transmitted through the holes also increases in a predictable manner. Hence, endpoint values for intensity can be assigned to determine when a components through holes have been adequately cleaned. For example, testing may be used as shown with graph 400 to determine an expected electromagnetic radiation intensity for a through hole of a particular size or diameter for a particular electromagnetic radiation source (e.g., for a particular wavelength or wavelength range), and this electromagnetic radiation intensity or a value somewhat lower (e.g., not requiring a hole to be returned to its full diameter or the like to avoid over etching) can be used for the transmission intensity threshold/endpoint 174.

In some embodiments of system 100, aspects of the signature or profile of the transmitted electromagnetic radiation 136 other than intensity or in addition to intensity may be utilized to determine the endpoint. The wavelength of electromagnetic radiation 134 from the source assembly 132 will diffract differently in differently sized holes. Further, it is expected that Fraunhofer scattering will be seen on the hole exit so that both intensity and pattern will change compared with the incident wavelength. These aspects of the transmitted electromagnetic radiation 136 may be monitored and compared to an expected profile (or alternative endpoint value 174) to detect the refurbishment endpoint. In some cases, as noted above, the approach is simplified into measuring the intensity of the transmitted electromagnetic radiation 136. By characterizing the intensity of electromagnetic radiation expected to pass through a specific size hole (diameter along with length), which can be thought of as the clean state of the hole, the controller can detect when during the cleaning process the "clean state of the hole" is reached and generate an alarm to alert the operator of system 100.

Figure 7:
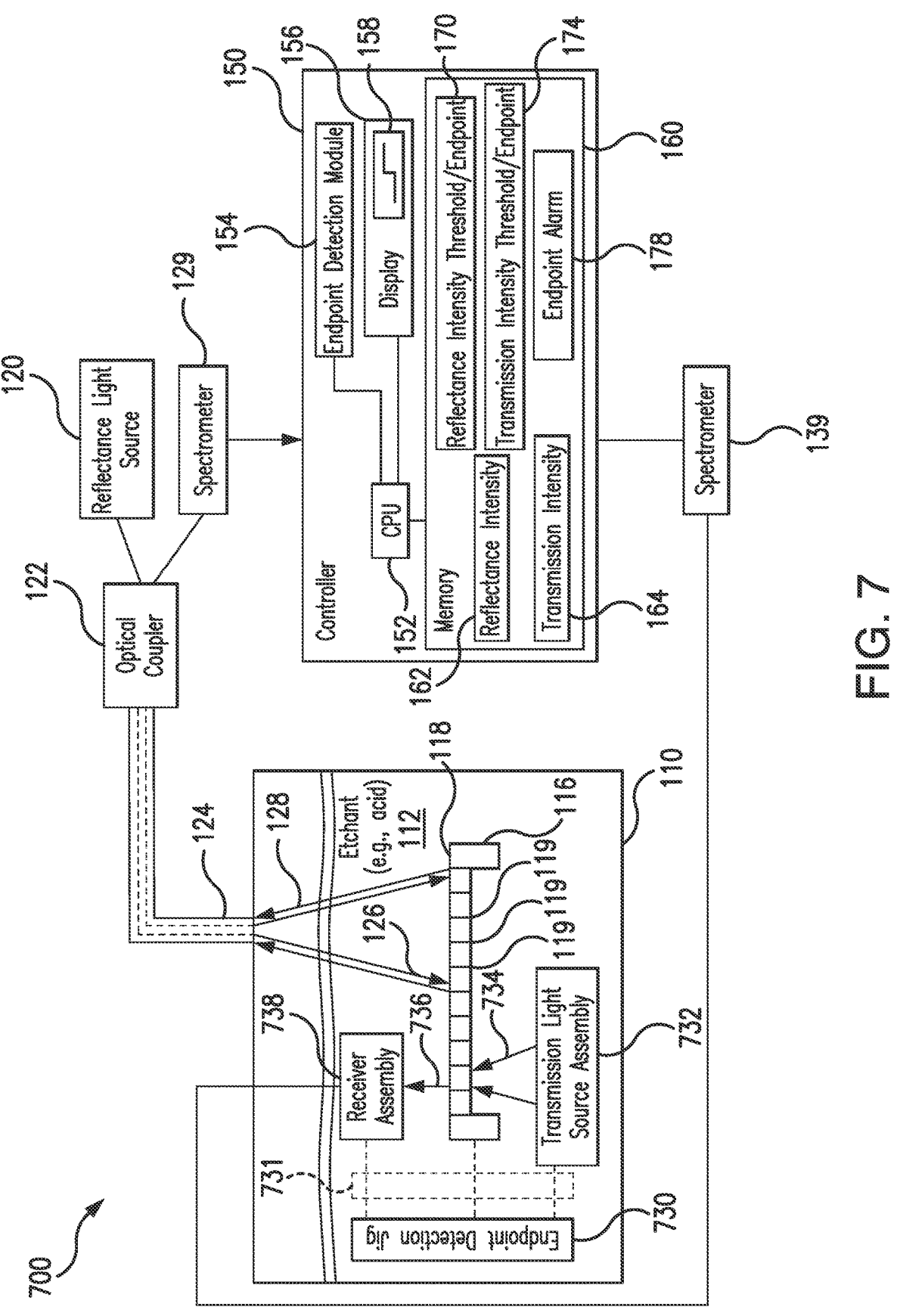
FIG. 7 is a functional block diagram of another exemplary endpoint detection system of the present description similar to the system of FIG. 1 showing the electromagnetic radiation transmitter or source and receiver immersed in the etchant bath.

FIG. 5 illustrates an exemplary embodiment of an endpoint detection jig or fixture 500 of the present description that may be used in an etchant (e.g., acid) bath such as for use as jig 730 placed in tank 110 of the system 700 of FIG. 7. The jig 500 is configured to support a chamber component with through holes, such as showerhead 510, between an electromagnetic radiation source assembly 520 and an electromagnetic radiation receiver 540 in a predefined position and/or with aligned orientation such that electromagnetic radiation output from assembly 520 passes through one or more through holes in the component 510 and is received or collected by the electromagnetic radiation receiver 540.

To this end, the jig or fixture 500 includes a support assembly 530 that includes an elongated body 532 from which a middle arm 534 extends that is configured for rigidly coupling the component 510 to the body 532 in an intermediate position with a known orientation (e.g., in a plane extending transverse to the body 530). The jig 500 further includes the electromagnetic radiation source assembly 520 that is coupled to an upper arm 536 extending outward from the body 532 in the same direction as middle arm 534. The electromagnetic radiation source assembly 520 includes a housing or body 522 for housing an electromagnetic radiation source (e.g., an LED, a laser, or the like), and an outlet 523 for the electromagnetic radiation is provided on the housing 522.

The housing 522 also contains an optical assembly for focusing the output electromagnetic radiation onto a surface of the component 510 and one or more through holes located on this surface, and the focusing may be achieved by manipulating portions of the housing 522 such as by rotating the outlet 523 in a clockwise and/or counterclockwise direction. To properly align or position the housing 522 and outlet 523 relative to the component 510, a pivotal extension arm 537 is provided on the upper support arm 536 and rigidly attached to the housing mounting plate or collar 526 that extends about an outer portion of the housing 522. The extension arm 537 can be pivoted until the housing 522 is in a desired location relative to the component 510 and then fasteners may be tightened to hold it in place on the upper support arm 536.

The jig 500 also includes the electromagnetic radiation receiver 540 that has a housing or body 542 with an inlet 543 for receiving electromagnetic radiation output or provided by the source assembly 520 that passes through one or more through holes in the component 510. Optical components may be provided for passing this electromagnetic radiation via tubing 524 (and fiber in tubing 524) to a spectrometer or other electromagnetic radiation detection device. In other cases, the spectrometer or other electromagnetic radiation detection device is positioned within housing 542 (with power and/or communication lines shown to be exiting an end of the housing 542 in FIG. 5), and power lines may also be run through tubing 524 to power and the electromagnetic radiation source in assembly 520. Several types of detectors can be used in the electromagnetic radiation receiver 540 to understand the sensitivity of the transmitted electromagnetic radiation. For example, a photomultiplier tube may be used that gives relatively high sensitivity. Other example receivers 540 may include a standard CCD-type spectrometer or a spectrometer modified for electromagnetic radiation scattering.

The receiver assembly 540 is held in position and alignment (with inlet 543 aligned with outlet 523) by a lower support arm 538 that extends outward from the body 532 in the same direction as the middle and upper arms 534 and 536. A housing mounting plate or collar 544 is provided on the receiver housing. A pivotal extension arm 539 is used to interconnect the mounting plate 544 to the lower support arm 538 in a pivotal manner until the outlet 543 is properly aligned with the outlet 523 of the electromagnetic radiation source assembly 520, and, then, fasteners are tightened or secured to hole the extension arm 539 and interconnected housing 542 in position (or in alignment).

Since all or most of the components of the jig 500 will be submerged in etchant when the component 510 is cleaned using an etchant bath, the components of the jig 500 or at least outer surfaces of such components are fabricated of an etchant-resistant material such as Kynar® polyvinylidene fluoride (PVDF) plastic or the like. These components typically include housing 522, tubing 524, mounting plate 526, support assembly 530, extension arm 539, housing 542, and mounting plate 544. Hence, these components of the jig 500 protect the electromagnetic radiation source and electromagnetic radiation receiver when submerged in an etchant, such as an acid, or other etchant while also orienting and aligning them with the concurrently supported process chamber component 510 when the entire (or most of) the jig 500 is submerged in the etchant for refurbishment of component 510.

FIG. 6 is a flow diagram for a refurbishment method 600 for a process chamber component (such as component 116 in FIG. 1) that includes monitoring transmission of electromagnetic radiation via through holes or passageways in a process chamber component to determine a process endpoint. The method 600 starts at 605 such as with providing a jig 500 as shown in FIG. 5, without the component 510, and with configuring a controller, such as controller 150, to receive output from a detection device in the electromagnetic radiation receiver 138 or 540. The step 605 may also include storing in memory 160 the transmission intensity threshold or endpoint values 174 and defining the endpoint alarm 178 (visual, audible, or both).

The method 600 continues at 610 with mounting a chamber component with through holes into the endpoint detection jig (such as jig 130 in FIG. 1 or jig 500 in FIG. 5). This may be an aluminum, stainless steel, titanium, or other metal part such as a showerhead used for CVD, ALD, or other deposition processes that have resulted in a deposition of materials in the through holes. At step 620, the method 600 continues with submerging the jig with the component, electromagnetic radiation source assembly, and electromagnetic radiation receiver in an etchant bath as shown in system 700 of FIG. 7. Note, in other examples, step 620 is modified to only submerge the component in the etchant and to support the source and receiver outside the etchant bath as shown for system 100 of FIG. 1.

The method 600 then involves at 630 directing electromagnetic radiation on the component that is focused on a surface of the component and one or more through holes. At step 640, the method 600 includes detecting electromagnetic radiation characteristics of the electromagnetic radiation transmitted through the one or more through holes of the component such as electromagnetic radiation intensity. In certain examples, the electromagnetic radiation may be within the visible waveband, as shown at 632. In accordance with certain examples, the electromagnetic radiation may be outside of the visible waveband, as shown at 634. For example, the electromagnetic radiation 126 may be within the infrared waveband.

At 650, a determination is made of whether the transmitted electromagnetic radiation has a characteristic such as intensity that matches or exceeds a predefined transmission threshold or endpoint value. This may involve a controller, such as controller 150 running endpoint detection module 154 to compare the detected transmission electromagnetic radiation intensity with the transmission intensity threshold or endpoint value, for a hole of similar size and an electromagnetic radiation source providing like types and/or wavelengths of electromagnetic radiation to the process chamber component. If the threshold is not matched or exceeded, the method 600 continues at 640.

If the threshold is matched or exceeded as determined at 650, the endpoint is detected and, at step 660, an endpoint alarm is generated by the controller such as controller 150 operating the display 156 to change the color of or illuminate an endpoint alarm or to provide an audible alert. The method 600 may then continue at 670 with the operator removing the jig and the supported component from the etchant bath. The method 600 may then end at 690.

Further, with regard to use of transmission to detect an endpoint, it may be desirable in some cases to immerse both the transmitter and the receiver of electromagnetic radiation in the etchant. In this regard, the system 700 may be provided that includes many of the components of system 100 of FIG. 1 that are labeled with like reference numbers and may take the form and functions discussed above with regard to FIG. 1.

As shown, the system 700 is shown to include an endpoint detection jig or fixture 730. The jig 730 is fabricated from etchant-resistant material, such as polytetrafluoroethylene (PTFE), polyethylene (HDPE), polypropylene (PP), and the like with one exemplary jig 730 being formed of Kynar® PVDF. The jig 730, as discussed above with reference to FIG. 5, is configured to couple with and support the process chamber component 116 when the jig 730 and component 116 are submerged in the etchant 112 in tank 110.

Further, the system 700 includes a transmission electromagnetic radiation source assembly 732. This assembly 732 typically will include a body or housing that is also formed of one or more etchant-resistant material. The jig 730 is configured to be connected with and support the electromagnetic radiation source assembly 732 within the etchant 112. Particularly, the housing or body of the assembly 732 is supported by the jig in a position relative the component 116 such that an electromagnetic radiation outlet in the housing or body is directed toward a surface opposite the surface 118 and one or more of the through holes 119.

The transmission electromagnetic radiation source assembly 732 includes an electromagnetic radiation source that, when operated or powered on, outputs or provides electromagnetic radiation 734 that is focused upon one or more through holes 119. The source assembly 732, to this end, may include an optical assembly for focusing the output electromagnetic radiation 734 onto the component 116 and a focusing mechanism to move one or more of the optical elements (e.g., lenses) of the optical assembly to achieve such focusing. The transmission electromagnetic radiation source in assembly 732 may be an LED or similar electromagnetic radiation source that is focused in this manner or may take the form of a white or colored (e.g., red, green, or other color) laser to provide collimated electromagnetic radiation to one or more of the through holes 119. In contrast to the reflectance electromagnetic radiation 126, the transmission electromagnetic radiation 734 is focused or collimated to have a greater intensity for enhanced detection upon passing through the component 116 via the one or more through holes 119.

To monitor transmission, the system 700 further includes a receiver assembly 738 adapted to receive or collect electromagnetic radiation 736 (i.e., a portion of electromagnetic radiation 734) transmitted through the component 116 via one or more through holes 119. The receiver assembly 738 may include a body, formed of one or more etchant-resistant material such as Kynar® PVDF, that is coupled to and supported by the endpoint detection jig 730 within the etchant 112 or above the level of etchant 112. The receiver assembly 738 may include an electromagnetic radiation inlet for receiving the electromagnetic radiation 736, and the jig 730 is configured to support the housing or body of the receiver assembly 738 such that the electromagnetic radiation inlet is aligned with the electromagnetic radiation outlet of the electromagnetic radiation source assembly 732 (e.g., so that the inlet is aligned with the same one or more through holes 119 targeted or focused upon by the source assembly and its electromagnetic radiation outlet). The receiver assembly 738 may include an optical assembly with one or more components for receiving the electromagnetic radiation 736, which may then be transmitted via optic fiber to a spectrometer 139. In other cases, the spectrometer 139 may be positioned within the housing or body of the receiver assembly 738.

Figure 8:
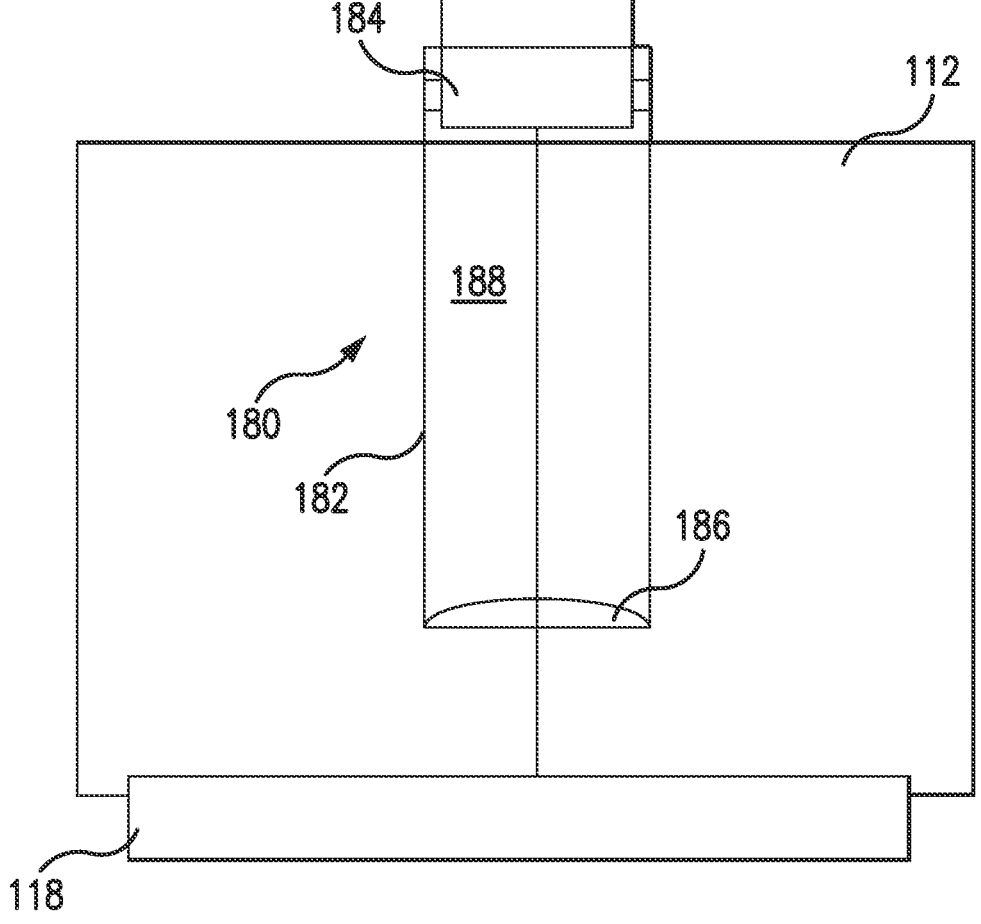
FIG. 8 illustrates a guide tube for the endpoint detection jig of the present description that may be used in the system of FIG. 1 to limit noise associated with the etchant bath employed to clean the chamber component.

FIG. 8 shows a guide tube 180 that may be used with the system 100. The guide tube 180 includes a tube body 182 with a sensor head 184 and a longitudinally opposite window 186. The sensor head 184 is configured to optically couple the window 186 to the reflectance light source 120 (shown in FIG. 1). The tube body 182 and window 186 are configured for immersion into the etchant 112, the window 186 being proximate to the process chamber component 118. Advantageously, a volume 188 defined within the tube body 182 between the window 186 and the sensor head 184 may be occupied by entrapped air upon partial immersion of the tube body 182 into the etchant bath 112, the entrapped air within the tube body 182 providing a clear optical path (e.g., without bubbles) between the sensor head 184 and the window 186, a signal generated by light traversing tube body 182 being relative clean (e.g., relatively little noise) in comparison to examples not including the tube body 182. To further, the longitudinal length of the tube body 182 limits distance through the etchant 112 that light emitted reflectance light source 120 need traverse to reach the process chamber component 118, further limiting noise in the signal carried by the light and reflected to the spectrometer 129.

Figure 9:
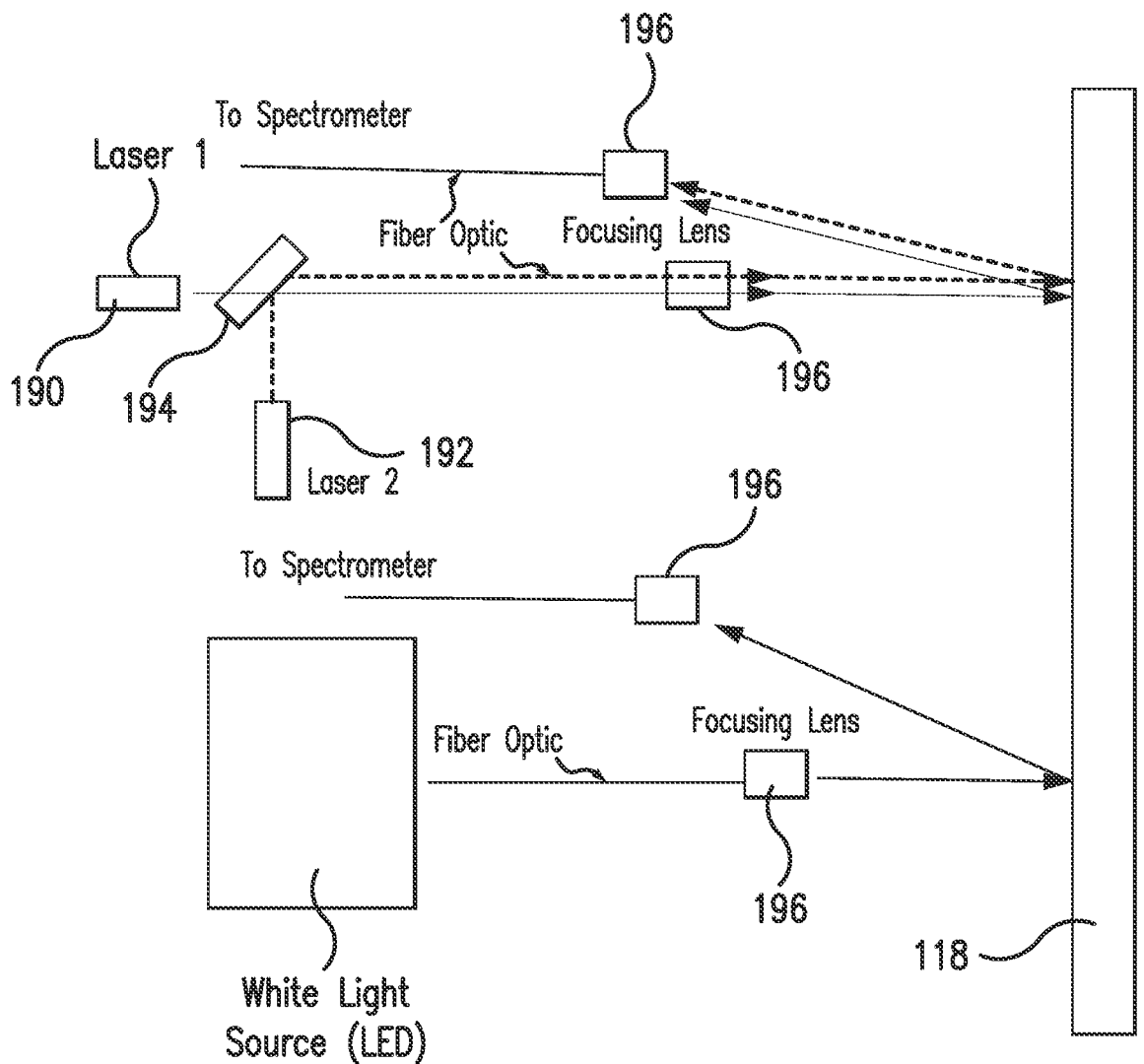
FIG. 9 illustrates a reflectance light source including two light sources for the endpoint detection jig of the present description that may be used in the system of FIG. 1 using a first wavelength from a first light source for endpoint detection and a second light source for noise reduction.

FIG. 9 shows an example of the system 100 including a first light source 190, a second light source 192, a dichroic mirror 194, and focusing lens 196. The first light source 190 has a waveband differing from that of the second light source, for example, a waveband insensitive to reflectance change exhibited by the process chamber component 118 as cleaning progresses. The dichroic mirror 194 combines light from the first light source 190 and the second light source 192 such that both the first light source 190 and the second light source 192 illuminate a common surface portion of the process chamber component 118. The focusing lens 196 optically couples the spectrometer 129 (shown in FIG. 1) to the first light source 190 and the second light source 192 via the process chamber component 118 and the dichroic mirror 194. Advantageously, the second light source provides a mechanism to indicate noise independence of reflectance change in the process chamber component 118, change in the second light attributable to noise being used to remove noise in reflected light received from the first light source 190, further limiting noise in the light employed to detect end point during cleaning of the process chamber component 118.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method of detecting an endpoint of a refurbishment process for process chamber components, comprising:

submerging a process chamber component in a volume of etchant;

transmitting electromagnetic radiation from an electromagnetic radiation source through the etchant onto the process chamber component;

receiving electromagnetic radiation from the process chamber component, wherein the received electromagnetic radiation comprises electromagnetic radiation transmitted through the process chamber component via one or more through holes having inlets on a surface of the process chamber component; and determining an endpoint of the refurbishment process for the process chamber component based on the received electromagnetic radiation, wherein the determining the endpoint comprises determining an intensity of the electromagnetic radiation transmitted from the one or more through holes and comparing the intensity with a transmission intensity threshold associated with a size of the one or more through holes.

2. The method of claim 1, wherein the received electromagnetic radiation comprises electromagnetic radiation reflected from a surface of the process chamber component.

3. The method of claim 2, wherein the determining of the endpoint comprises determining an intensity of the electromagnetic radiation reflected from the surface and comparing the intensity with a reflectance intensity threshold associated with the surface free of deposition materials.

4. The method of claim 1, wherein the electromagnetic radiation from the electromagnetic radiation source is non-collimated electromagnetic radiation focused on the inlets of the one or more through holes or is collimated electromagnetic radiation provided to the inlets of the one or more through holes.

5. The method of claim 1, further comprising mounting the process chamber component in a jig between the electromagnetic radiation source and an electromagnetic radiation receiving assembly adapted to perform the receiving step, wherein the submerging of the process chamber component comprises at least partially submerging the jig in the etchant.

6. The method of claim 5, wherein the jig orients and aligns the process chamber component with the one or more through holes between the electromagnetic radiation source and an inlet of the electromagnetic radiation receiving assembly.

7. The method of claim 1, wherein the determining of the endpoint includes determining when both the reflectance intensity threshold and the transmission intensity threshold are met or exceeded.

8. The method of claim 1, wherein the electromagnetic radiation comprises visible waveband electromagnetic radiation.

9. The method of claim 1, wherein the electromagnetic radiation comprises electromagnetic radiation outside of a visible waveband.

10. The method of claim 1, wherein the electromagnetic radiation traverses entrapped air within the etchant.

* * * * *